United States Patent
Kwon et al.

(10) Patent No.: US 9,735,286 B2
(45) Date of Patent: Aug. 15, 2017

(54) THIN FILM TRANSISTOR SUBSTRATE HAVING HIGH RELIABILITY METAL OXIDE SEMICONDUCTOR MATERIAL

(71) Applicants: LG Display Co., Ltd., Seoul (KR); Industry-Academic Cooperation Foundation, Yonsei University, Seoul (KR)

(72) Inventors: Jangyeon Kwon, Seoul (KR); Jonguk Bae, Seoul (KR); Juheyuck Baeck, Seoul (KR); Kyung Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/156,263

(22) Filed: May 16, 2016

(65) Prior Publication Data
US 2016/0343878 A1  Nov. 24, 2016

(30) Foreign Application Priority Data
May 22, 2015 (KR) .......................... 10-2015-0071966

(51) Int. Cl.
*H01L 29/786* (2006.01)
*H01L 21/02* (2006.01)
(Continued)

(52) U.S. Cl.
CPC .. *H01L 29/78693* (2013.01); *H01L 21/02565* (2013.01); *H01L 21/02584* (2013.01); *H01L 21/02592* (2013.01); *H01L 21/02631* (2013.01); *H01L 27/127* (2013.01); *H01L 27/1225* (2013.01); *H01L 29/247* (2013.01); *H01L 29/66969* (2013.01); *H01L 29/78606* (2013.01); *H01L 29/78696* (2013.01)

(58) Field of Classification Search
CPC ............. H01L 29/78693; H01L 29/247; H01L 27/1225; H01L 27/127; H01L 21/02565; H01L 29/66969; H01L 21/02592; H01L 29/78696
See application file for complete search history.

(56) References Cited

U.S. PATENT DOCUMENTS 9,269,315 B2* 2/2016 Miyake ................ G09G 3/3655
2008/0164476 A1 7/2008 Park et al.
(Continued)

OTHER PUBLICATIONS

European Extended Search Report, European Application No. 16170044.8, Sep. 29, 2016, 8 pages.

*Primary Examiner* — David Vu
(74) *Attorney, Agent, or Firm* — Fenwick & West LLP

(57) ABSTRACT

The present disclosure relates to a thin film transistor substrate having a high reliability oxide semiconductor material including a metal oxide semiconductor material. A thin film transistor substrate includes a substrate, a gate electrode disposed on the substrate, a semiconductor layer including an oxide semiconductor material combining one or more of indium, gallium and zinc, oxygen, and a doping material. The doping material may be a group 15 or 16 gaseous element. The semiconductor layer has a channel area overlapping with the gate electrode with a gate insulating layer, a source area extended from one side of the channel area, and a drain area extended from another side of the channel area, a source electrode connected to the source area, and a drain electrode connected to the drain area.

19 Claims, 9 Drawing Sheets

(51) Int. Cl.
*H01L 27/12* (2006.01)
*H01L 29/24* (2006.01)
*H01L 29/66* (2006.01)

(56) References Cited

U.S. PATENT DOCUMENTS

2011/0278567 A1   11/2011   Ye
2012/0319103 A1   12/2012   Lee

* cited by examiner

THIN FILM TRANSISTOR SUBSTRATE HAVING HIGH RELIABILITY METAL OXIDE SEMICONDUCTOR MATERIAL

CROSS-REFERENCE TO RELATED APPLICATIONS

This application claims the benefit of Republic of Korea Patent Application No. 10-2015-0071966 filed on May 22, 2015, which is incorporated herein by reference for all purposes as if fully set forth herein.

BACKGROUND OF THE INVENTION

Field of the Invention

The present disclosure relates to a thin film transistor (or "TFT") substrate having a high reliability oxide semiconductor material including a metal oxide semiconductor material. Especially, the present disclosure relates to a TFT substrate having a metal oxide semiconductor material such as Indium-Gallium-Zinc oxide material doped with the gaseous impurity elements such as nitrogen.

Discussion of the Related Art

Nowadays, as a lot of portable appliances such as the mobile phone, the personal digital assistant, and the notebook computer are fluently used, and various flat panel display devices are developed for overcoming many drawbacks of the cathode ray tube such as heavy weight and bulk volume. The flat panel display devices include the liquid crystal display device (or LCD), the field emission display (or FED), the plasma display panel (or PDP), and the organic light emitting diode display (or OLED). Because of compatibility with mass production technology, easiness of driving means, high quality & high resolution display, and/or low power consumption, the flat panel displays, including the liquid crystal displays and/or the organic light emitting diode displays, adopt a substrate having a plurality of thin film transistors arrayed in a matrix manner, so it is called the 'active matrix type thin film transistor substrate'.

The most used active matrix type thin film transistor substrates use the amorphous silicon thin film transistor as the switching element for driving the pixels. As the amorphous silicon thin film transistors have some merits of low manufacturing price and the relatively lower temperature process than other thin film transistors, they are widely adopted for the switching elements of the thin film transistor substrates for the flat panel display.

However, as the amorphous silicon material has the lower mobility and the inferior electrostatic property (or "constant current property") than others, the large area display using them as the switching elements may be hard to ensure good quality. To overcome these disadvantages of the amorphous silicon elements, the thin film transistor having poly-silicon materials are applied to the flat panel display. The thin film transistor including the poly-silicon materials also has disadvantages such as high manufacturing cost difficulty in ensuring uniform properties of the semiconductor material over the whole surface of the substrate and a very high temperature manufacturing process. Further, the electrostatic property of the poly-silicon material is not better than that of the amorphous silicon material but is rather at a similar level.

To overcome these problems, recently, the oxide thin film transistor including oxide semiconductor material is suggested for application to flat panel displays. As the oxide thin film transistor can be manufactured in lower temperature processes and its electrostatic property is much superior to the amorphous silicon material and the poly-silicon material, it is possible to obtain a thin film transistor for the flat panel display having better property and characteristics with lower price.

For the currently focused material in the oxide semiconductor, there are some materials based on Zinc Oxide such as the Indium-Zinc Oxide (or "IZO"), Indium-Gallium-Zinc Oxide (or "InGaZnO"), and/or Indium-Tin-Zinc Oxide (or "ITZO"). Especially, amorphous Indium-Gallium-Zinc Oxide (or "a-InGaZnO4: a-IGZO") is one of the best materials. As a-IGZO thin film transistor substrate can be manufactured using the same processes and equipments used for amorphous silicon thin film transistor substrate with better quality, it is not required to invest for manufacturing and/or fabricating equipments. That is, the conventionally used equipments can be used as is. As for the depositing method for a-IGZO, the sputtering method is the best for commercializing, among various methods.

For the thin film transistor having the oxide semiconductor material, the top gate structure and the bottom gate structure can be applied. When the bottom gate structure is applied to the oxide thin film transistor, the back channel etched type and the etch stopper type can be considered. Especially, the etch stopper type is better for getting high quality.

Even though the IGZO semiconductor materials have many merits, they also have some disadvantages. For example, the property and/or the reliability of the oxide semiconductor thin film transistor may be degraded, when it is used for a long time. It is noticed that this degradation is caused by defects in the layers of the oxide semiconductor material.

In order to ensure the reliability of the thin film transistor including the metal oxide semiconductor materials, there are some conventional methods. For example, the oxide semiconductor material is isolated from the outer material or a plasma treatment is conducted to the oxide semiconductor material. However, these methods cannot be the fundamental solution. Further, these methods require any additional processes and/or the expensive equipments.

For example, a method is suggested in which the plasma treatment is conducted after the IGZO thin film is deposited. This method requires additional plasma treatment equipment so that additional manufacturing price is required and the manufacturing time is longer. Further, the IGZO film may be damaged by the plasma treatment process. The recovery process may be required after the plasma treatment which may increase the manufacturing time and cost.

For another method, by depositing the aluminum oxide ($Al_2O_3$) layer on the IGZO surface, the reliability of the IGZO can be enhanced. In that case, as the process for depositing the aluminum oxide layer is added after forming the IGZO semiconductor layer, the cost and the time for manufacturing the device is increased. Even though the aluminum oxide layer may protect the IGZO from external air causing the degradation of the reliability, the reliability by the defects from the IGZO thin film itself cannot be solved.

For still another method, there is a thermal treatment under high oxygen gas pressure. This is for enhancing the reliability by reducing the oxygen vacancy that is one of the reasons for the defects of the IGZO thin film itself. As this method requires specific oxygen thermal treatment equipment, the cost and time for this thermal treatment are required. Further, as the oxygen particles are implanted into the IGZO semiconductor material, the characteristics of the IGZO semiconductor material may be changed. In the case that the oxygen occupies the vacancy in the IGZO material, the electron mobility may be remarkably degraded.

Consequently, for manufacturing the thin film transistor and/or the thin film transistor substrate having oxide semiconductor material, a method for solving the defects due to the characteristics of the oxide semiconductor material is needed. Further, the method should enhance the reliability of the oxide semiconductor material without any additional cost and process steps for manufacturing a device having the oxide semiconductor material.

SUMMARY OF THE INVENTION

In order to overcome the above mentioned drawbacks, the purpose of the present disclosure is to suggest a thin film transistor substrate having high reliability metal oxide semiconductor material. Another purpose of the present disclosure is to suggest a thin film transistor substrate ensuring high reliability under the constant current stress condition by enhancing the deep-level defect condition of the metal oxide semiconductor material.

In order to accomplish the above purpose, the present disclosure suggests a thin film transistor substrate comprising: a substrate; a gate electrode disposed on the substrate; a semiconductor layer including an oxide semiconductor material combining any one of indium, gallium and zinc, oxygen and a doping material, wherein the semiconductor layer has a channel area overlapping with the gate electrode with a gate insulating layer, a source area extended from one side of the channel area, and a drain area extended from another side of the channel area; a source electrode connected to the source area; a drain electrode connected to the drain area; a passivation layer covering the source electrode and the drain electrode; and a pixel electrode disposed on the passivation layer and connected to the drain electrode.

In one embodiment, sum of contents of the any one of the indium, the gallium and the zinc and contents of the oxygen is 95 to 99 atomic % of the oxide semiconductor material, and contents of the doping material is 1 to 5 atomic % of the oxide semiconductor material.

In one embodiment, the doping material is any one of group 15 elements and group 16 elements.

In one embodiment, the doping material includes any one of nitrogen (N), phosphorus (P), fluorine (F), selenium (Se) and tellurium (Te).

In one embodiment, the doping material is included as bonding to any one of the indium, the gallium and the zinc.

Embodiments also relate to a thin film transistor substrate including a substrate, a gate electrode disposed on the substrate, and a semiconductor layer. The semiconductor layer includes a channel area, in which at least a portion of the channel area overlaps with the gate electrode and includes a first oxide semiconductor material that is a combination of oxygen, a doping material, and one or more of indium, gallium, and zinc. The thin film transistor substrate also includes a source area extending from one side of the channel area, and a drain area extending from another side of the channel area. A gate insulating layer is in between the gate electrode and the semiconductor layer. A source electrode is connected to at least a portion of the source area, and a drain electrode is connected to at least a portion of the drain area.

In one embodiment, the oxygen and the one or more of indium, gallium, and zinc in sum are 95 to 99 atomic % of the first oxide semiconductor material, and the doping material is 1 to 5 atomic % of the first oxide semiconductor material.

In one embodiment, the doping material is any one of group 15 elements or group 16 elements.

In one embodiment, the doping material includes any one selected from a group consisting of nitrogen (N), phosphorus (P), fluorine (F), selenium (Se), and tellurium (Te).

In one embodiment, the doping material is bonded to the one or more of indium, gallium, and zinc.

In one embodiment, the source area and the drain area include the first oxide semiconductor material.

In one embodiment, the source area and the drain area include a second oxide semiconductor material that is a combination of oxygen and one or more of indium, gallium, and zinc without the doping material of the first oxide semiconductor material.

In one embodiment, at least a portion of the source area and at least a portion of the drain area are conductorized.

Embodiments also relate to a method of forming a thin film transistor substrate. A gate electrode is formed on a substrate. A semiconductor layer is formed. The semiconductor layer includes a channel area, a source area extending from one side of the channel area, and a drain area extending from another side of the channel area. At least a portion of the channel area overlaps with the gate electrode and includes a first oxide semiconductor material that is a combination of oxygen, a doping material, and one or more of indium, gallium, and zinc. A gate insulating layer is formed in between the gate electrode and the semiconductor layer. A source electrode is formed to connect to at least a portion of the source area, and a drain electrode is formed to connect to at least a portion of the drain area.

In one embodiment, the one or more of indium, gallium, and zinc is deposited on the substrate with exposure to oxygen gas and gas of the dopant material in a chamber.

In one embodiment, the one or more of indium, gallium, and zinc is deposited by sputtering from one or more of an indium target, a gallium target, and a zinc target.

In one embodiment, an amount of the dopant material gas is 50% to 70% of an amount of total gas in the chamber.

In one embodiment, the oxygen and the one or more of indium, gallium, and zinc in sum are 95 to 99 atomic % of the first oxide semiconductor material, and the doping material is 1 to 5 atomic % of the first oxide semiconductor material.

In one embodiment, the doping material is any one of group 15 elements or group 16 elements.

In one embodiment, the doping material includes any one selected from a group consisting of nitrogen (N), phosphorus (P), fluorine (F), selenium (Se), and tellurium (Te).

In one embodiment, the doping material is bonded to the one or more of indium, gallium, and zinc.

In one embodiment, plasma treatment is applied to at least a portion of the source area and the drain area to conductorize the portion of the source area and the drain area.

In one embodiment, a layer of the first oxide semiconductor material is deposited on the substrate. The layer of the first oxide semiconductor material is patterned to form the channel area and the source and drain areas of the semiconductor layer.

In one embodiment, the channel area is formed. A layer of a second oxide semiconductor material that is a combination of oxygen and one or more of indium, gallium, and zinc without the doping material is deposited. The layer of the second oxide semiconductor material is patterned to form the source and drain areas of the semiconductor layer.

The present disclosure suggests a thin film transistor substrate having an oxide semiconductor material in which any one material of the group 15 (or 5A) elements or the group 16 (or 6A) elements is doped such as the nitrogen gas into the metal oxide semiconductor material so that the defects by the oxygen vacancy can be enhanced. The thin film transistor and/or the thin film transistor substrate including the doped metal oxide semiconductor material have the high reliability in which the characteristics are not changed under the constant current stress condition. Further, in a method for manufacturing the metal oxide semiconductor layer, as the material such as the nitrogen is doped using currently installed equipments, it is possible to get high reliability metal oxide semiconductor elements without any increasement of the manufacturing cost and/or the complexity of the manufacturing process.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
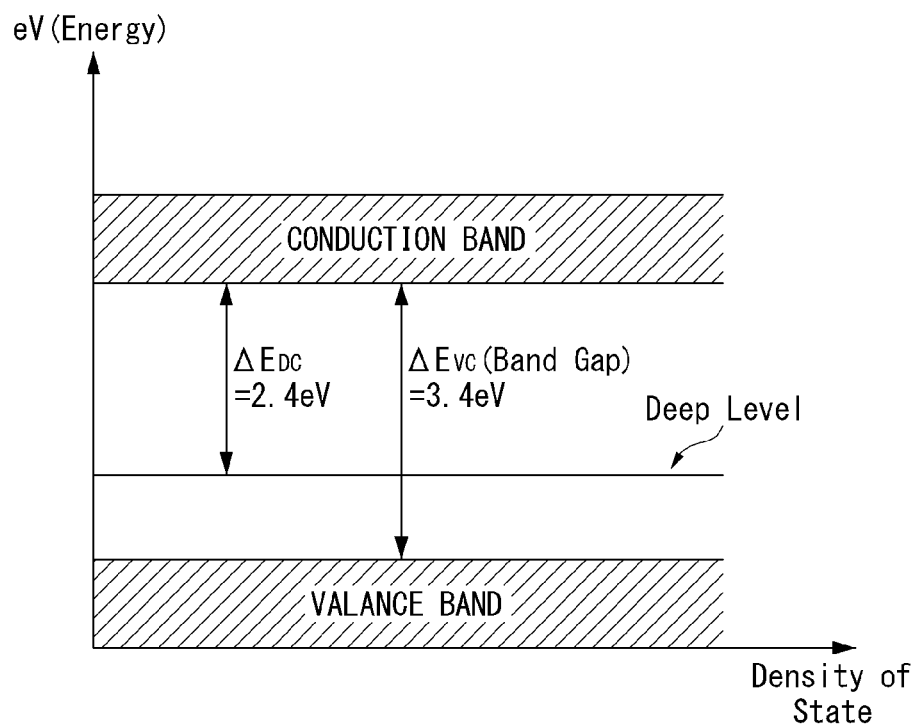
FIG. 1 is a schematic view illustrating the energy levels of the Indium-Gallium-Zinc Oxide (IGZO) semiconductor material.

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

Referring to FIG. 1, we will explain the reason for degradation of the Indium-Gallium-Zinc Oxide (IGZO), one of the metal oxide semiconductor materials. FIG. 1 is a schematic view illustrating the energy levels (or "energy band gaps") of the Indium-Gallium-Zinc Oxide (IGZO) semiconductor material. The IGZO is one of the semiconductor materials in which indium (In), gallium (Ga), and/or zinc (Zn) are bonded with oxygen. The band gap energy between the valance band and the conduction band, $\Delta E_{VC}$, is about 3.4 eV, as shown in FIG. 1.

For forming the IGZO thin film, the preferable process is the sputtering method. Therefore, the IGZO thin film has the complex structure in which indium oxide, gallium oxide, and zinc oxide are linked to each other. As the oxygen bonding tendencies (or 'bonding energies') of indium, gallium, and zinc are different from each other, there are some oxygen vacancies in which some of the indium, gallium, and zinc are not bonded with the oxygen. This oxygen vacancy can be represented in the energy level as the "Deep-Level" which is formed near the valace band. The energy difference between the deep-level and the conduction band, $\Delta E_{DC}$, is about 2.4 eV. The deep-level of the IGZO has a little higher energy level than the valance band. Therefore, the electrons at the valance band energy level can easily be transited to the deep-level. And then, with lower energy, the electrons can be transitioned to the conduction band. As a result, the carrier mobility of IGZO is very high.

However, when the thin film transistor including the IGZO for the channel element is used for a long time or exposed to very intensive light, the mobility characteristics of the IGZO may be degraded. One of the main reasons noticed is that the oxygen vacancy (or defect state) causing the "deep-level" is increased, then the electrons transitioned into the "deep-level" from the valance band may be trapped in "deep-level", so that these trapped electrons may hinder the transition to the conduction band. In other words, if the amount of defects forming the "deep-level" is too many, the electrons transitioned from the valance band are not transitioned to the conduction band but still remains in the "deep-level." This is called the "deep level trap".

To solve the deep level trap, one method is the oxygen implanting, in force, for controlling the amount of the oxygen vacancies. However, in that case, the "deep-level" may disappear so that the carrier mobility of the IGZO may be degraded.

In the present disclosure, instead of the oxygen implantation for filling up the oxygen vacancies, the group 15 (or 5A) gaseous elements or the group 16 (or 6A) gaseous elements similar to oxygen is doped into the IGZO, for maintaining the "deep-level" in optimized condition. For example, nitrogen (N), phosphorus (P), fluorine (F), selenium (Se), or tellurium (Te) is doped into the IGZO so that the thin film transistor is made of the impurity doped metal oxide semiconductor material.

Especially, the present disclosure suggests a method for doping the impurity into the IGZO layer during forming the IGZO layer using the sputtering process. For example, as the nitrogen gas is supplied to the depositing chamber, the nitrogen doped IGZO layer may be formed on a substrate. Hereinafter, we will use nitrogen as the representative doping material. For a person of ordinary skill in the art, it is obvious that any group 15 (or 5A) elements and/or group 16 (or 6A) elements can be used instead of the nitrogen gas.

The present disclosure does not suggest a thin film transistor or a method for manufacturing a thin film transistor with a new material such as IGZON in which the nitrogen is combined with the IGZO. In the present disclosure, the thin film having the nitrogen doped IGZO (or "N-doped IGZO") is formed wherein the defect amount having the "deep-level" is controlled in a proper amount.

For the case that the IGZO thin film is formed using the sputtering process, a substrate is installed within the vacuum chamber and indium, gallium, and zinc are installed at target positions. The sputtering process is conducted to the target while supplying the argon (Ar) gas and the oxygen (O) gas into the vacuum chamber. In the present disclosure, nitrogen (N) gas is further supplied into the vacuum chamber. Thus, one or more selected from indium, gallium, and zinc is deposited on the substrate with exposure to oxygen gas and gas of the dopant material in a chamber. As a result, the N doped IGZO thin film would be deposited on the substrate.

Figure 2A:
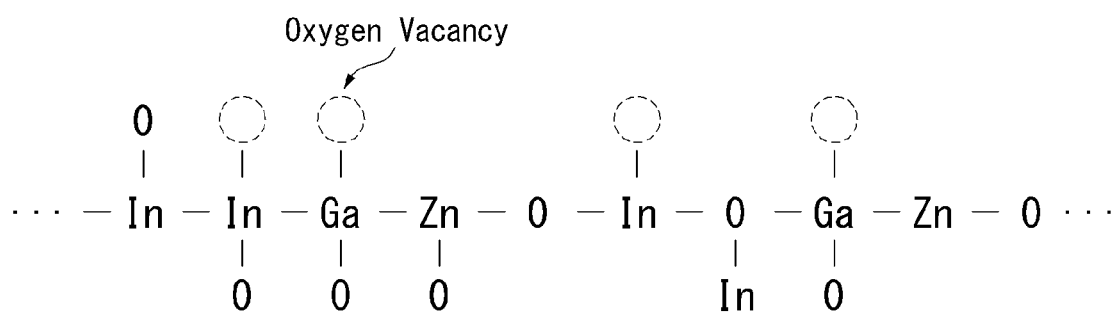
FIG. 2A is a schematic view illustrating the structure of the Indium-Gallium-Zinc Oxide (IGZO) semiconductor material, according to related art.
Figure 2B:
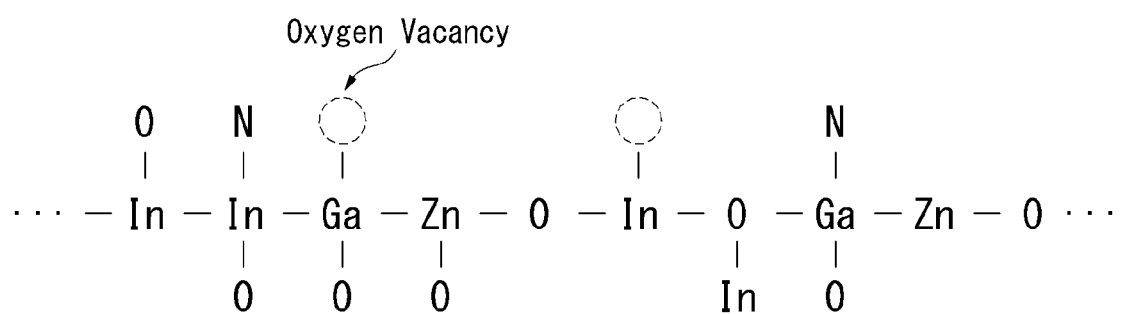
FIG. 2B is a schematic view illustrating the structure of the nitrogen doped Indium-Gallium-Zinc Oxide (IGZO) semiconductor material, according to the present disclosure.

FIG. 2A is a schematic view illustrating the structure of the Indium-Gallium-Zinc Oxide (IGZO) semiconductor material, according to the related art. FIG. 2B is a schematic view illustrating the structure of the nitrogen doped Indium-Gallium-Zinc Oxide (IGZO) semiconductor material, according to the present disclosure. Referring to FIG. 2A, as indium, gallium, and zinc are bonded to each other or with oxygen, the indium-gallium-zinc oxide (IGZO) is formed. However, there may be some oxygen vacancies where some portions for bonding with the oxygen are not occupied by oxygen. Here, the bonding relationship shown in FIG. 2A is just for easiness of explanation.

Referring to FIG. 2B, when indium, gallium, and zinc are bonding with each other or to oxygen to form indium-gallium-zinc oxide material, by adding the nitrogen, the nitrogen occupies some of the oxygen vacancies. The nitrogen particles are not occupying all oxygen vacancies but it is preferable that the nitrogen particles are occupying 60% to 80% of the oxygen vacancies.

In the present disclosure, by doping the nitrogen into IGZO, nitrogen bonds to some of the oxygen vacancies. Here, if all of the oxygen vacancies are filled with nitrogen, the electron mobility would be remarkably degraded. Therefore, it is preferable that the optimized amount of oxygen vacancies should remain. For example, 80% of the oxygen vacancies would be recovered (filled) and 20% of them can be remained in the vacancy condition. To do so, we measure the characteristic of a plurality of the N-doped IGZO thin films after forming each of the N-doped IGZO thin films by changing the ratio of the nitrogen gas amount to the total amount of gases.

Changing the ratio of the nitrogen gas amount (atomic composition of nitrogen atoms in the chamber) such as 0%, 25%, 50%, 60%, and 70% of the total gas amount in the chamber, the N doped IGZO thins film having 100 nm thickness are formed. Measuring the characteristics, the composition ratios of the N doped IGZO thin films according to the nitrogen gas amount are shown in Table 1.

TABLE 1

| Doping Gas Ratio | 0% | 25% | 50% | 60% | 70% |
|---|---|---|---|---|---|
| Contents of Indium (atomic %) | 22.0 | 21.3 | 23.0 | 21.7 | 24.2 |
| Contents of Gallium (atomic %) | 12.8 | 16.1 | 13.7 | 11.5 | 12.0 |
| Contents of Zinc (atomic %) | 6.4 | 7.3 | 5.8 | 6.3 | 6.3 |
| Contents of Oxygen (atomic %) | 58.8 | 54.5 | 56.3 | 55.5 | 56.5 |
| Doping Contents of Nitrogen (atomic %) | 0.0 | 0.8 | 1.2 | 5.0 | 1.0 |

For each N doped IGZO formed according to above various conditions, we measured the changes of the reliability under the constant current stress (or "electrostatic stress") condition. We got the results as shown in FIGS. 3A and 3B.

Figure 3A:
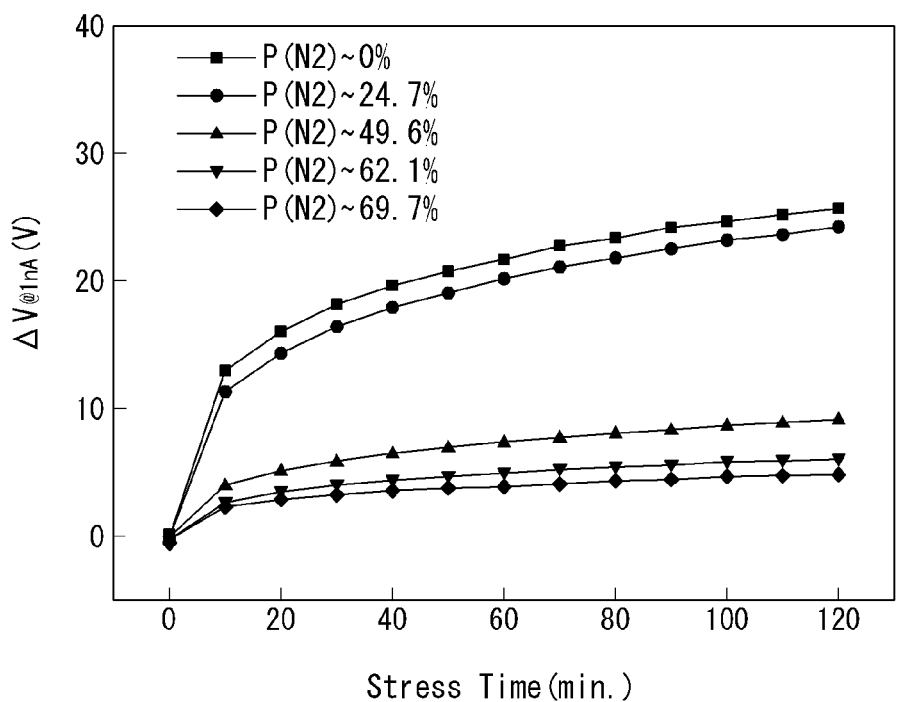
FIGS. 3A and 3B are graphs illustrating the reliabilities of the nitrogen doped Indium-Gallium-Zinc Oxide (IGZO) semiconductor material, according to the present disclosure.

FIG. 3A is a graph set illustrating the change of characteristics under Positive Bias Stress conditions without the incident light. FIG. 3B is a graph set illustrating the change of characteristics under Positive Bias Stress conditions with the incident light.

Figure 3B:
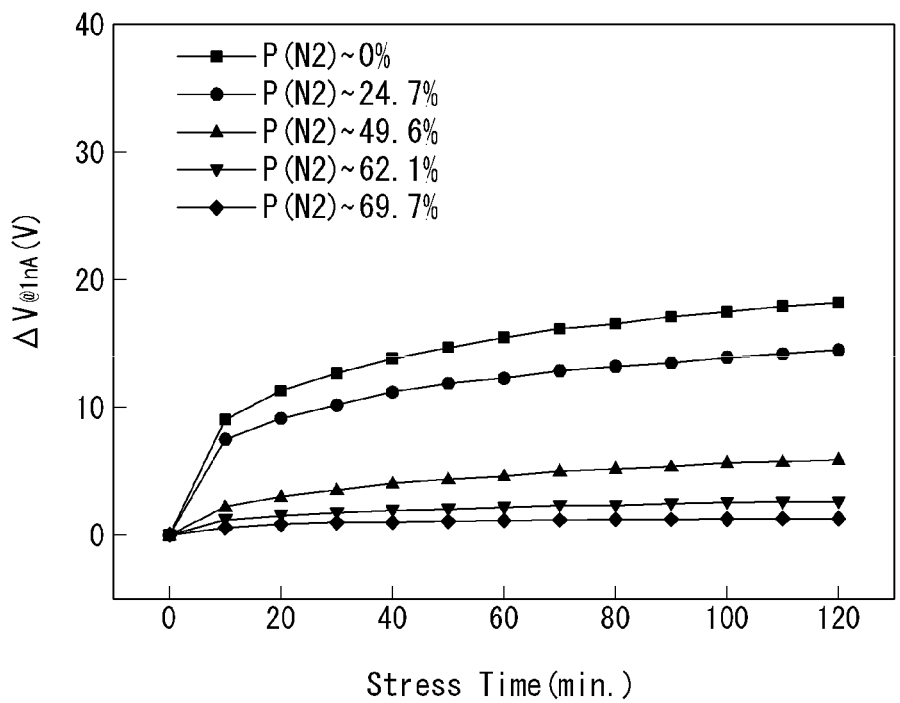

Referring to FIGS. 3A and 3B, it is shown that the N doped IGZO has remarkably enhanced reliability. FIGS. 3A and 3B are the graphs illustrating the reliability of the N doped IGZO. According to FIG. 3A, the reliability is enhanced without the incident light. According to FIG. 3B, the reliability is also enhanced with the incident light. Especially, with the nitrogen gas ratio of 50% to 70%, the reliabilities are remarkably enhanced. Consequently, it is noticed that with the doping contents (or 'amount') of nitrogen into the IGZO of 1 atomic % to 5 atomic %, the reliabilities are optimized. Considering the manufacturing processes, it is preferable that the doping contents of the nitrogen into the IGZO are 1 atomic % to 2 atomic %. Here, the "atomic %" is used for the unit of contents of the element; as well the "%" can be alternatively used.

Figure 4:
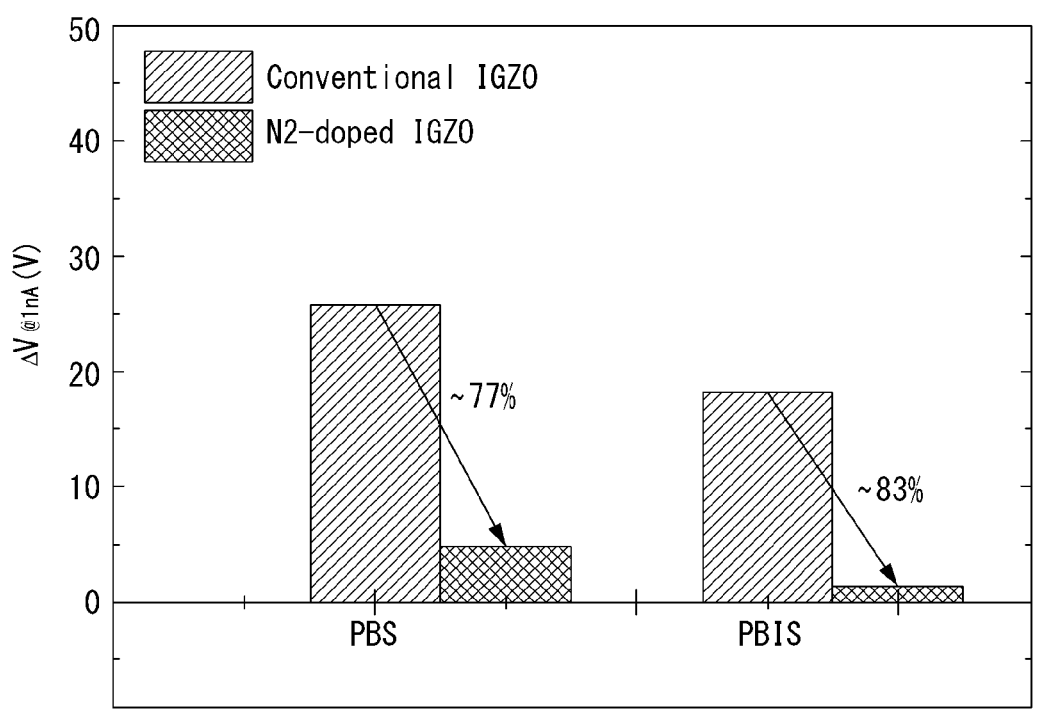
FIG. 4 is a graph illustrating a comparison between the characteristics of the nitrogen doped IGZO according to the present disclosure and the IGZO according to the related art, under constant current stress conditions.

According to the reliability characteristics of the N doped IGZO, we can get the graph as shown in FIG. 4. FIG. 4 is a graph illustrating a comparison between the characteristics of the nitrogen doped IGZO according to the present disclosure and the conventional IGZO according to the related art, under the constant current stress condition. Referring to FIG. 4, without incident light, the reliability is enhanced about 77% while it is enhanced about 83% with the incident light.

Hereinafter, we will explain some examples of the thin film transistor substrate having the N doped IGZO. The thin film transistor substrate having the N doped IGZO according to the present disclosure can be applied to the liquid crystal display or the organic light emitting diode display. Especially, it is very adaptable for the display requiring high speed driving property due to the high mobility characteristics of the IGZO. As the IGZO is in the amorphous state, the IGZO thin film can be formed over a large area substrate with consistent quality of the IGZO semiconductor characteristics. Further, as the IGZO thin film is deposited in the amorphous state, the characteristics are not changed or shifted after depositing on the glass substrate or the plastic substrate which are in an amorphous state also. Therefore, it is preferable to get a thin film transistor substrate for the flat panel display having the high mobility property.

Hereinafter, we will explain about some preferred embodiments for the thin film transistor substrate including N doped IGZO (N doped Indium Gallium Zinc Oxide). Here, we will focus on the liquid crystal display. However, these embodiments are not restricted to the liquid crystal display only, but applied to any type of display using the N doped IGZO thin film transistor substrate.

First Embodiment

Figure 5:
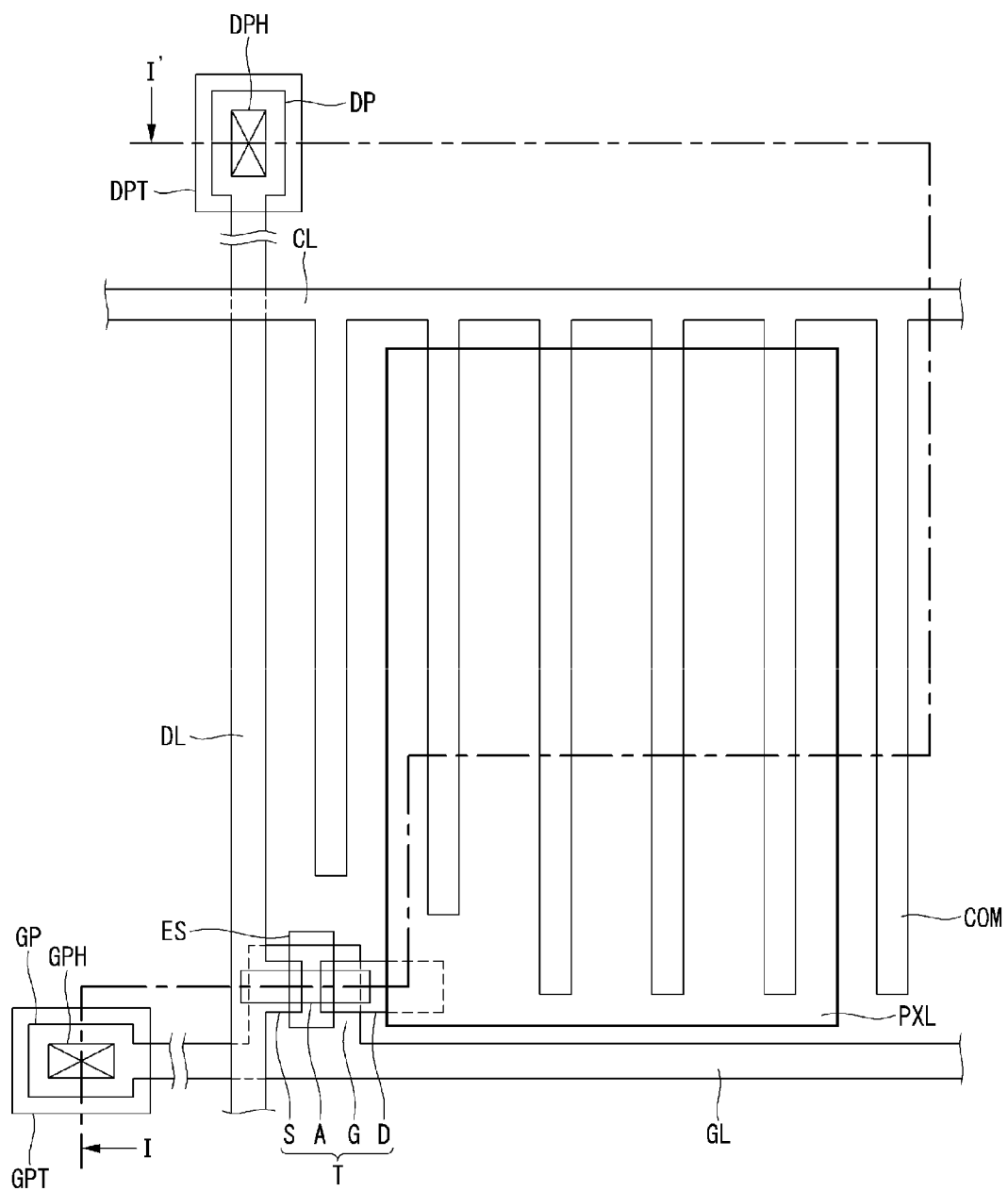
FIG. 5 is a plane view illustrating a structure of the thin film transistor substrate according to the first embodiment of the present disclosure.
Figure 6:
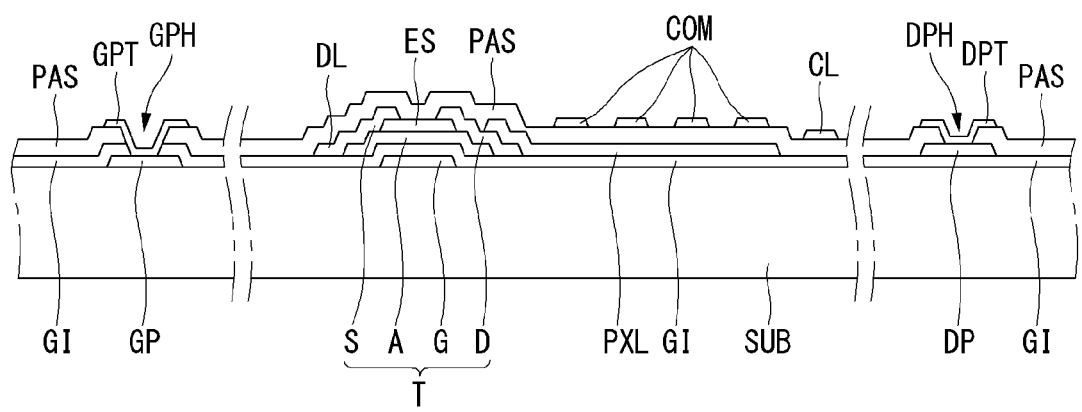
FIG. 6 is a cross-sectional view illustrating the structure of the thin film transistor substrate, along the line I-I' in FIG. 5.

Hereinafter, we will explain about the first embodiment of the thin film transistor substrate in which the N doped IGZO is used for the semiconductor layer. FIG. 5 is a plane view illustrating a structure of the thin film transistor substrate according to the first embodiment of the present disclosure. FIG. 6 is a cross-sectional view illustrating the structure of the thin film transistor substrate, along to the line I-I' in FIG. 5.

According to FIGS. 5 and 6, the thin film transistor substrate according to the first embodiment of the present disclosure comprises a gate line GL and a data line DL crossing each other with a gate insulating layer GI there-between on a lower substrate SUB, and a thin film transistor T disposed at each crossing area of the gate line GL and the data line DL. A pixel area is defined by the crossing structure of the gate line GL and the data line DL. In the pixel area, a pixel electrode PXL and a common electrode COM are formed as being overlapped each other with a passivation layer PAS there-between so that they form a fringe electric field. The pixel electrode PXL may have a rectangular shape corresponding to the shape of the pixel area. The common electrode COM may have a plurality of segmented strips parallelly disposed each other. Otherwise, the shapes of the pixel electrode PXL and the common electrode COM may be switched each other.

The common electrode COM connects or links to a common line CL disposed as being parallel with the gate line GL. The common electrode COM is supplied with a reference voltage (or "common voltage") used for forming the electric field for driving the liquid crystal layer.

Responding to the gate signal supplied to the gate line GL, the thin film transistor TFT can charge the pixel signal from the data line DL to pixel electrode PXL, and maintain the pixel signal on the pixel electrode PXL. The thin film transistor T comprises a gate electrode G branched from the gate line GL, a source electrode S branched from the data line DL, a drain electrode D facing with the source electrode S and connected to the pixel electrode PXL, and a semiconductor layer A. The semiconductor layer A has a channel area defined between the source electrode S and the drain electrode D as overlapping with the gate electrode G on the gate insulating layer GI. Further, ohmic layers may be included between the semiconductor layer A and the source electrode S and between the semiconductor layer A and the drain electrode D for ensuring the ohmic contact between them.

Especially, the semiconductor layer A includes the N doped IGZO (or "N doped Indium Gallium Zinc Oxide") according to the present disclosure. Due to the high carrier mobility characteristics of the N doped IGZO, a large area thin film transistor substrate which requires large amount of charging capacitance for driving the liquid crystal may be formed with excellent properties and performance. For ensuring the stability of the oxide semiconductor material, an etch stopper ES may be further included as covering the upper surface of the oxide semiconductor layer A for protecting from the etchant. In detail, when forming the source electrode S and the drain electrode D, the etchant may attack the oxide semiconductor layer A exposed between the source electrode S and the drain electrode D. In order to prevent the semiconductor layer A from this etchant, it is preferable that the etch stopper ES is formed on the semiconductor layer before depositing the source-drain metal material.

At one end of the gate line GL, a gate pad GP is formed for receiving the gate signal from an external device. The gate pad GP may contact a gate pad terminal GPT through a gate pad contact hole GPH penetrating the gate insulating layer GI and the passivation layer PAS. Further, at one end of the data line DL, a data pad DP is formed for receiving the pixel signal from an external device. The data pad DP may contact a data pad terminal DPT through a data pad contact hole DPH penetrating the gate insulating layer GI and the passivation layer PAS.

The pixel electrode PXL is formed on the gate insulating layer GI and connected to the drain electrode D. The common electrode COM is formed on the passivation layer PAS covering the pixel electrode PXL so that it overlapped with the pixel electrode PXL. Between the pixel electrode PXL and the common electrode COM, a fringe electric field is formed so that the liquid crystal molecules of the liquid crystal layer disposed between the thin film transistor substrate and the color filter substrate are rotated by the dielectric anisotropy of the liquid crystal moleculars. According to the rotating amount of the liquid crystal moleculars, the light transmittance of the pixel area is differed, and then the video image can be represented.

Second Embodiment

Figure 7:
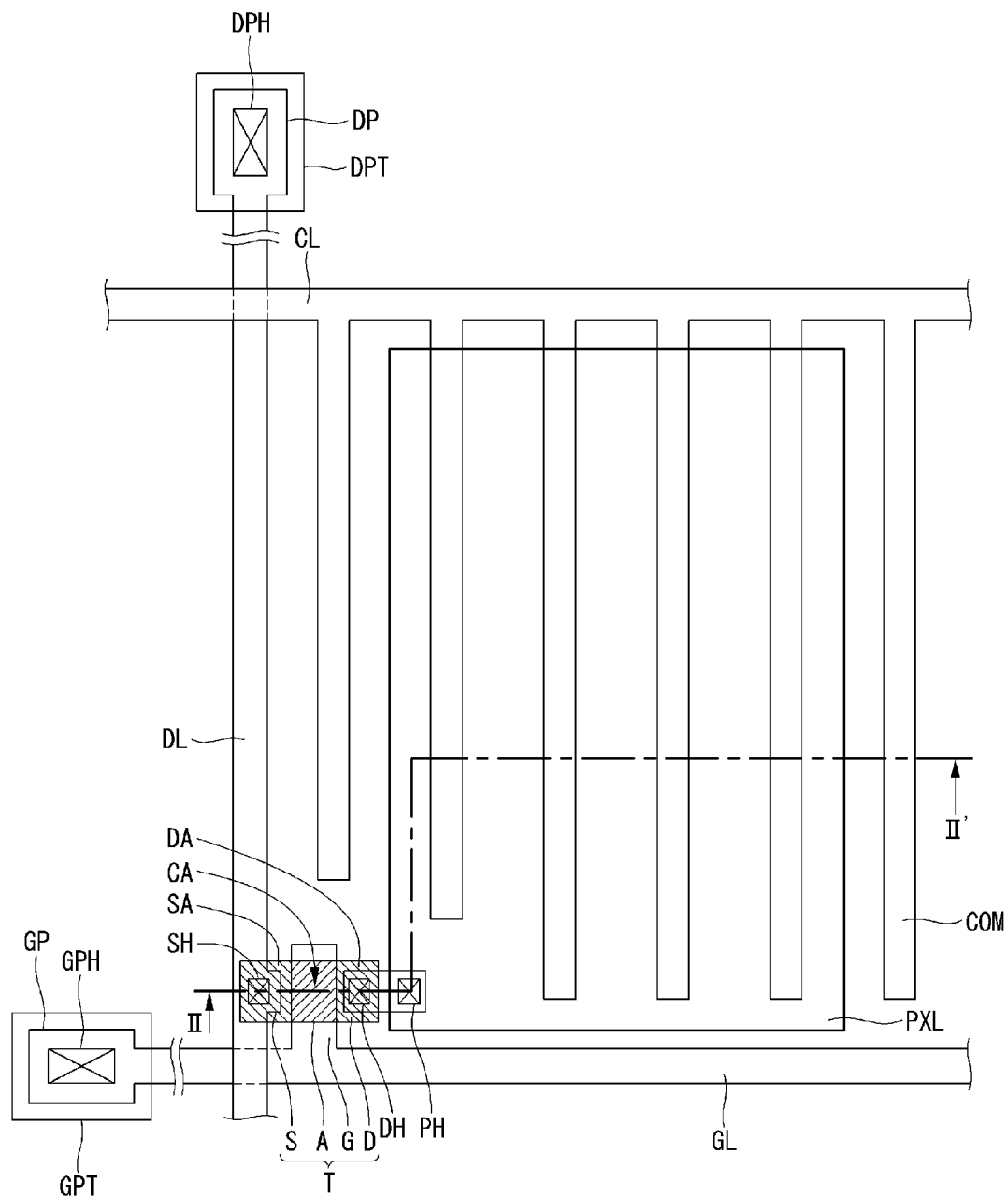
FIG. 7 is a plane view illustrating a structure of the thin film transistor substrate according to the second embodiment of the present disclosure.
Figure 8:
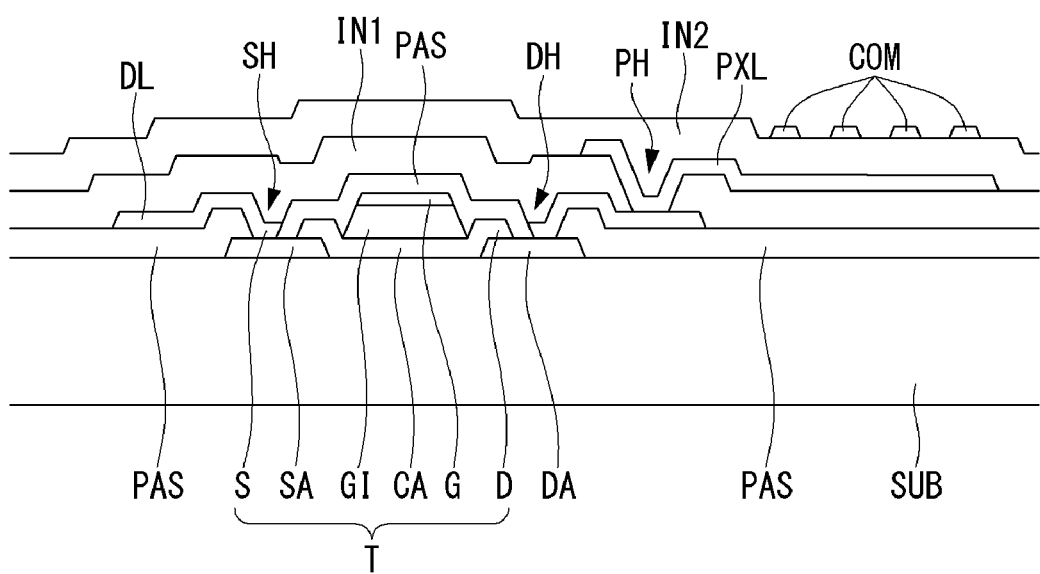
FIG. 8 is a cross-sectional view illustrating the structure of the thin film transistor substrate, along the line II-II' in FIG. 7.

Hereinafter, we will explain about the second embodiment of the thin film transistor substrate in which the N doped IGZO is used for the semiconductor layer. FIG. 7 is a plane view illustrating a structure of the thin film transistor substrate according to the second embodiment of the present disclosure. FIG. 8 is a cross-sectional view illustrating the structure of the thin film transistor substrate, along to the line II-II' in FIG. 7.

According to FIGS. 7 and 8, the thin film transistor substrate according to the second embodiment of the present disclosure comprises a gate line GL and a data line DL crossing each other with a gate insulating layer GI there-between on a lower substrate SUB, and a thin film transistor T disposed at each crossing area of the gate line GL and the data line DL. A pixel area is defined by the crossing structure of the gate line GL and the data line DL. In the pixel area, a pixel electrode PXL and a common electrode COM are formed as being overlapped with each other with a passivation layer PAS there-between so that they form a fringe electric field. The pixel electrode PXL may have a rectangular shape corresponding to the shape of the pixel area. The common electrode COM may have a plurality of segmented strips parallelly disposed each other. Otherwise, the shapes of the pixel electrode PXL and the common electrode COM may be switched each other.

The common electrode COM connects or links to a common line CL disposed as being parallel with the gate line GL. The common electrode COM is supplied with a reference voltage (or "common voltage") used for forming the electric field for driving the liquid crystal layer.

Responding to the gate signal supplied to the gate line GL, the thin film transistor TFT can charge the pixel signal from the data line DL to pixel electrode PXL, and maintain the pixel signal on the pixel electrode PXL. The thin film transistor T comprises a source electrode S branched from the data line DL, a drain electrode D facing the source electrode S and connected to the pixel electrode PXL, a semiconductor channel layer or channel area CA disposed between the source electrode S and the drain electrode D, and a gate electrode G overlapping with the semiconductor channel layer CA on a gate insulating layer GI covering the semiconductor channel layer CA. The gate electrode G is branched from or connected to the gate line GL.

In the second embodiment, the semiconductor layer includes two parts: one part is the semiconductor channel layer or channel area CA and the other part is the source-drain area SA and DA. Especially, the semiconductor channel layer CA includes the N doped IGZO (or "N doped Indium Gallium Zinc Oxide") according to the present disclosure. Most portions of the semiconductor channel layer CA is overlapped with the gate electrode G for defining the channel area. The second part of the semiconductor layer connected to the semiconductor channel area CA at both end portions are conductorized by the plasma treatment on the oxide semiconductor material and are defined as the source area SA and the drain area DA. The source area SA is connected to the source electrode S through a source contact hole SH. The drain area DA is connected to the drain electrode D through a drain contact hole DH.

The oxide semiconductor layer of the second embodiment is divided into the source area SA connected to the source electrode S, the drain area DA connected to the drain electrode D, and the semiconductor channel layer CA overlapping with the gate electrode G between the source area SA and the drain area DA. In detail, as one example, the oxide semiconductor layer including N doped IGZO is formed on the substrate SUB and then the plasma treatment is conducted at both end portions of the oxide semiconductor layer. As a result, the both end portions are defined as the source area SA and the drain area DA, while the middle portions of the oxide semiconductor layer is defined as the semiconductor channel layer or channel area CA. In another example, as shown in FIG. 8, the oxide semiconductor material such as IGZO (not "N doped IGZO") is deposited and then conductorized by the plasma treatment. By patterning the conductorized semiconductor material, the source area SA and the drain area DA are formed. On the substrate SUB having the source-drain area SA-DA, the semiconductor channel layer CA is formed using the N doped IGZO. Alternatively, the semiconductor channel layer CA may be formed before the source area SA and the drain area DA are formed.

In the second embodiment, the semiconductor channel layer CA is defined by the shape of the gate electrode G overlapping on the gate insulating layer GI. Both end portions to the channel layer CA, the source area SA and the drain area DA, are connected to the source electrode S and the drain electrode D, respectively, but they are not overlapped with the gate electrode G. The source electrode S and the drain electrode D are disposed as being apart from the gate electrode G so that the source-drain electrodes S and D are not overlapped with the gate electrode G. As there is no parasitic capacitance between the gate electrode G and the source-drain electrode S-D, the high quality thin film transistor substrate can be acquired.

At one end of the gate line GL, a gate pad GP is formed for receiving the gate signal from an external device. The gate pad GP may contact a gate pad terminal GPT through a gate pad contact hole GPH penetrating the second insulating layer IN2 and the first insulating layer IN1. Further, at one end of the data line DL, a data pad DP is formed for receiving the pixel signal from an external device. The data pad DP may contact a data pad terminal DPT through a data pad contact hole DPH penetrating the second insulating layer IN2 and the first insulating layer IN1.

Over the thin film transistor T including the N doped IGZO, the first insulating layer IN1 is deposited. On the first insulating layer IN1, the pixel electrode PXL is formed as connecting to the drain electrode D through a pixel contact hole PH penetrating the first insulating layer IN1. Over the pixel electrode PXL, the second insulating layer IN2 is deposited. The common electrode COM is formed on the second insulating layer IN2 as overlapping with the pixel electrode PXL. Between the pixel electrode PXL and the common electrode COM, a fringe electric field is formed so that the liquid crystal molecules of the liquid crystal layer disposed between the thin film transistor substrate and the color filter substrate are rotated by the dielectric anisotropy of the liquid crystal moleculars. According to the rotating amount of the liquid crystal moleculars, the light transmittance of the pixel area is differed, and then the video image can be represented. In the above embodiments, a liquid crystal display for application of the thin film transistor substrate including the N doped IGZO was explained. It is noticed that the thin film transistor substrate according to the embodiments of the present disclosure can be applied to any kinds of the flat panel display including the field emission display, the plasma display panel and the organic light emitting diode display.

Figure 9:
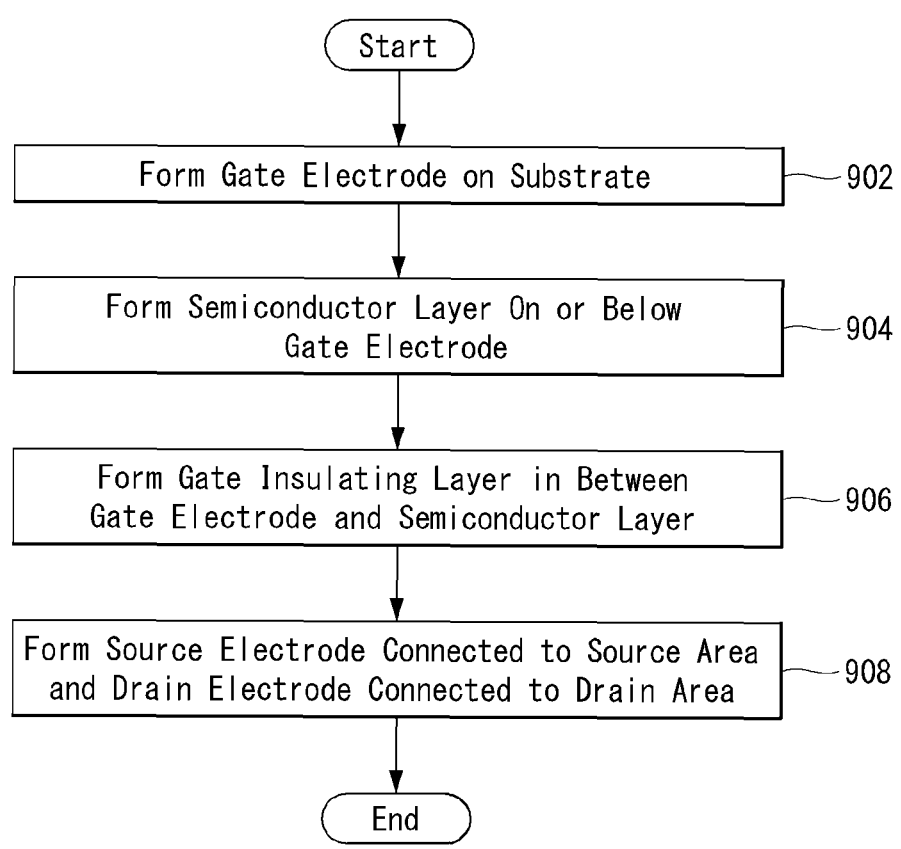
FIG. 9 is a flowchart illustrating a method of fabricating a thin film transistor substrate, according to the present disclosure.

FIG. 9 is a flowchart illustrating a method of fabricating a thin film transistor substrate, according to the present disclosure.

A gate electrode is formed 902 on a substrate. A semiconductor layer is formed 904 on or below the gate electrode. The semiconductor layer may have a channel area, a source area, and a drain area. At least the channel area of the semiconductor layer may include an oxide semiconductor material that is a combination of oxygen, a doping material, and one or more of indium, gallium, and zinc. The semiconductor layer may be formed of the oxide semiconductor material including the doping material. Alternatively, the channel area may be formed of the oxide semiconductor material including the doping material and the source and drain areas may be formed of an oxide semiconductor material without the doping material.

A gate insulating layer is formed 906 between the gate electrode and the semiconductor layer. A source electrode and a drain electrode are formed 908 to connect to at least a portion of the source area and at least a portion of the drain area, respectively.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:
1. A thin film transistor substrate comprising:
a substrate;
a gate electrode disposed on the substrate;
a semiconductor layer, the semiconductor layer comprising:
 a channel area, at least a portion of the channel area overlapping with the gate electrode and including a first oxide semiconductor material that is a combination of oxygen, a doping material, indium, gallium, and zinc, the first oxide semiconductor material comprising oxygen vacancies, wherein doping material particles occupy 60-80% of the oxygen vacancies;
 a source area extending from one side of the channel area; and
 a drain area extending from another side of the channel area;
a gate insulating layer in between the gate electrode and the semiconductor layer;
a source electrode connected to at least a portion of the source area;
a drain electrode connected to at least a portion of the drain area.
2. The thin film transistor substrate of claim 1, wherein the oxygen and the indium, gallium, and zinc in sum are 95 to 99 atomic % of the first oxide semiconductor material, and wherein the doping material is 1 to 5 atomic % of the first oxide semiconductor material.

3. The thin film transistor substrate of claim 1, wherein the doping material is any one of group 15 elements or group 16 elements.

4. The thin film transistor substrate of claim 3, wherein the doping material includes any one selected from a group consisting of nitrogen (N), phosphorus (P), fluorine (F), selenium (Se), and tellurium (Te).

5. The thin film transistor substrate of claim 3, wherein the doping material is bonded to the indium, gallium, and zinc.

6. The thin film transistor substrate of claim 1, wherein the source area and the drain area include the first oxide semiconductor material.

7. The thin film transistor substrate of claim 1, wherein the source area and the drain area include a second oxide semiconductor material that is a combination of oxygen and one or more of indium, gallium, and zinc without the doping material of the first oxide semiconductor material.

8. The thin film transistor substrate of claim 1, wherein at least a portion of the source area and at least a portion of the drain area are conductorized.

9. A method of forming a thin film transistor substrate, the method comprising:
   forming a gate electrode on a substrate;
   forming a semiconductor layer, the semiconductor layer including a channel area, a source area extending from one side of the channel area, and a drain area extending from another side of the channel area, at least a portion of the channel area overlapping with the gate electrode and including a first oxide semiconductor material that is a combination of oxygen, a doping material, indium, gallium, and zinc, the first oxide semiconductor material comprising oxygen vacancies, wherein the doping material particles occupy 60-80% of the oxygen vacancies;
   forming a gate insulating layer in between the gate electrode and the semiconductor layer;
   forming a source electrode connected to at least a portion of the source area; and
   forming a drain electrode connected to at least a portion of the drain area.

10. The method of claim 9, wherein forming the semiconductor layer comprises:
   depositing the indium, gallium, and zinc on the substrate with exposure to oxygen gas and gas of the dopant material in a chamber.

11. The method of claim 10, wherein depositing the indium, gallium, and zinc comprises sputtering an indium target, a gallium target, and a zinc target.

12. The method of claim 10, wherein an amount of the dopant material gas is 50% to 70% of an amount of total gas in the chamber.

13. The method of claim 9, wherein the oxygen and the indium, gallium, and zinc in sum are 95 to 99 atomic % of the first oxide semiconductor material, and wherein the doping material is 1 to 5 atomic % of the first oxide semiconductor material.

14. The method of claim 9, wherein the doping material is any one of group 15 elements or group 16 elements.

15. The method of claim 14, wherein the doping material includes any one selected from a group consisting of nitrogen (N), phosphorus (P), fluorine (F), selenium (Se), and tellurium (Te).

16. The method of claim 14, wherein the doping material is bonded to the indium, gallium, and zinc.

17. The method of claim 9, wherein forming the semiconductor layer further comprises applying plasma treatment to at least a portion of the source area and the drain area to conductorize the portion of the source area and the drain area.

18. The method of claim 9, wherein forming the semiconductor layer comprises:
   depositing a layer of the first oxide semiconductor material on the substrate; and
   patterning the layer of the first oxide semiconductor material to form the channel area and the source and drain areas of the semiconductor layer.

19. The method of claim 9, wherein forming the semiconductor layer comprises:
   forming the channel area;
   depositing a layer of a second oxide semiconductor material that is a combination of oxygen and one or more of indium, gallium, and zinc without the doping material on or below the channel area; and
   patterning the layer of the second oxide semiconductor material to form the source and drain areas of the semiconductor layer.

* * * * *

UNITED STATES PATENT AND TRADEMARK OFFICE
CERTIFICATE OF CORRECTION

PATENT NO. : 9,735,286 B2  
APPLICATION NO. : 15/156263  
DATED : August 15, 2017  
INVENTOR(S) : Jangyeon Kwon et al.

Page 1 of 1

It is certified that error appears in the above-identified patent and that said Letters Patent is hereby corrected as shown below:

On the Title Page

Item (73) Assignee, after "LG Display Co., Ltd., Seoul (KR)" insert --; Industry-Academic Cooperation Foundation, Yonsei University, Seoul (KR)--

Signed and Sealed this  
Twenty-first Day of November, 2017

Joseph Matal  
*Performing the Functions and Duties of the*  
*Under Secretary of Commerce for Intellectual Property and*  
*Director of the United States Patent and Trademark Office*